United States Patent
Nishiyama et al.

(10) Patent No.: US 9,018,719 B2
(45) Date of Patent: Apr. 28, 2015

(54) MAGNETORESISTIVE ELEMENT AND MAGNETIC MEMORY

(75) Inventors: Katsuya Nishiyama, Yokohama (JP); Hisanori Aikawa, Yokohama (JP); Tadashi Kai, Tokyo (JP); Toshihiko Nagase, Yokohama (JP); Koji Ueda, Kamakura (JP); Hiroaki Yoda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 221 days.

(21) Appl. No.: 13/424,301

(22) Filed: Mar. 19, 2012

(65) Prior Publication Data

US 2013/0001714 A1  Jan. 3, 2013

(30) Foreign Application Priority Data

Jun. 30, 2011 (JP) .................................. 2011-146718

(51) Int. Cl.
  *H01L 29/82* (2006.01)
  *G11C 11/16* (2006.01)
  *H01L 43/08* (2006.01)
  *H01L 27/22* (2006.01)

(52) U.S. Cl.
  CPC ................ *G11C 11/16* (2013.01); *H01L 43/08* (2013.01); *H01L 27/228* (2013.01)

(58) Field of Classification Search
  CPC ...... G11C 11/16; H01L 43/08; H01L 27/228; H01L 43/10; B82Y 25/00
  USPC .................................................. 257/421–427
  See application file for complete search history.

(56) References Cited

U.S. PATENT DOCUMENTS

| 7,663,197 | B2 | 2/2010 | Nagase |
| 8,299,552 | B2 | 10/2012 | Nagase et al. |
| 2007/0086121 | A1 | 4/2007 | Nagase et al. |
| 2008/0253174 | A1* | 10/2008 | Yoshikawa et al. ........... 365/158 |
| 2009/0079018 | A1 | 3/2009 | Nagase et al. |
| 2009/0080239 | A1* | 3/2009 | Nagase et al. ................ 365/158 |
| 2009/0243008 | A1* | 10/2009 | Kitagawa et al. ............. 257/421 |
| 2010/0080050 | A1 | 4/2010 | Ozeki et al. |
| 2011/0073970 | A1 | 3/2011 | Kai et al. |
| 2013/0094284 | A1 | 4/2013 | Ohno et al. |

FOREIGN PATENT DOCUMENTS

| CN | 101399312 A | 4/2009 |
| JP | 2010-080746 | 4/2010 |

(Continued)

OTHER PUBLICATIONS

D.C. Worledge et al. "Spin torque switching of perpendicular Ta | CoFeB|MgO-based magnetic tunnel junctions" Applied Physics Letters 98, 022501 (2011) in 3 pages.

(Continued)

*Primary Examiner* — David Vu
*Assistant Examiner* — Jonathan Han
(74) *Attorney, Agent, or Firm* — Knobbe Martens Olson & Bear LLP

(57) ABSTRACT

According to one embodiment, a magnetoresistive element includes a storage layer having a perpendicular and variable magnetization, a reference layer having a perpendicular and invariable magnetization, a shift adjustment layer having a perpendicular and invariable magnetization in a direction opposite to a magnetization of the reference layer, a first nonmagnetic layer between the storage layer and the reference layer, and a second nonmagnetic layer between the reference layer and the shift adjustment layer. A switching magnetic field of the reference layer is equal to or smaller than a switching magnetic field of the storage layer, and a magnetic relaxation constant of the reference layer is larger than a magnetic relaxation constant of the storage layer.

40 Claims, 13 Drawing Sheets

(56) References Cited

FOREIGN PATENT DOCUMENTS

| JP | 2010-232447 | 10/2010 |
|----|-------------|---------|
| JP | 2011-071352 | 4/2011 |
| JP | 2011-258596 | 12/2011 |

OTHER PUBLICATIONS

Office Action dated Jan. 27, 2014 in CN App No. 201210097760.X.
Japanese Office Action dated Sep. 30, 2014 for JP Application No. 2011-146718 filed on Jun. 30, 2011.

* cited by examiner

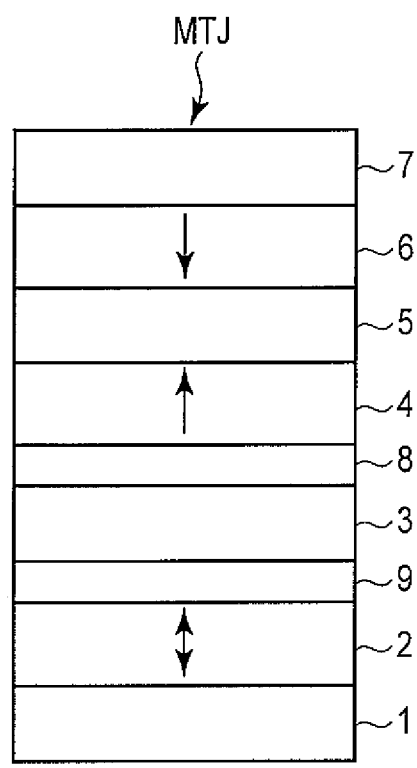
F I G. 3

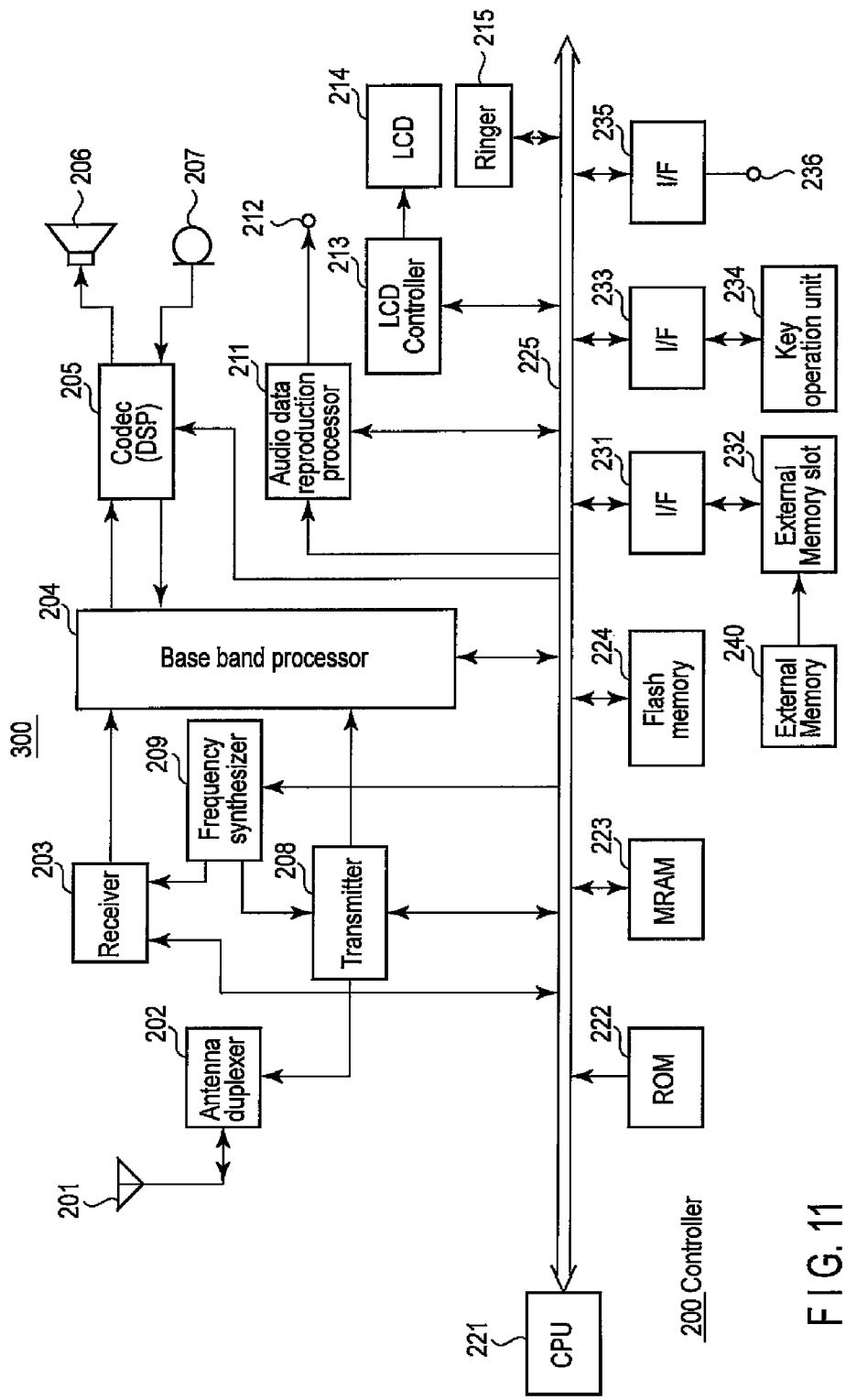
F I G. 11

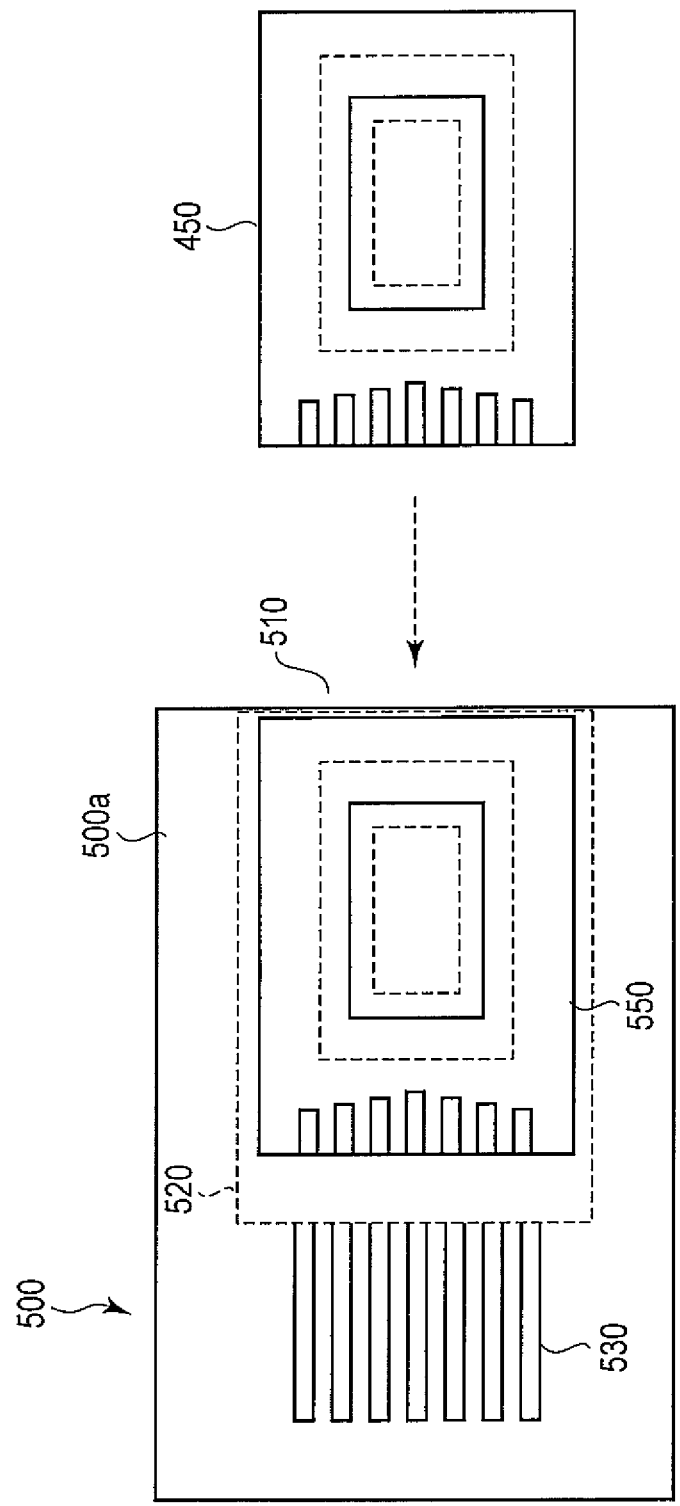
F I G. 13

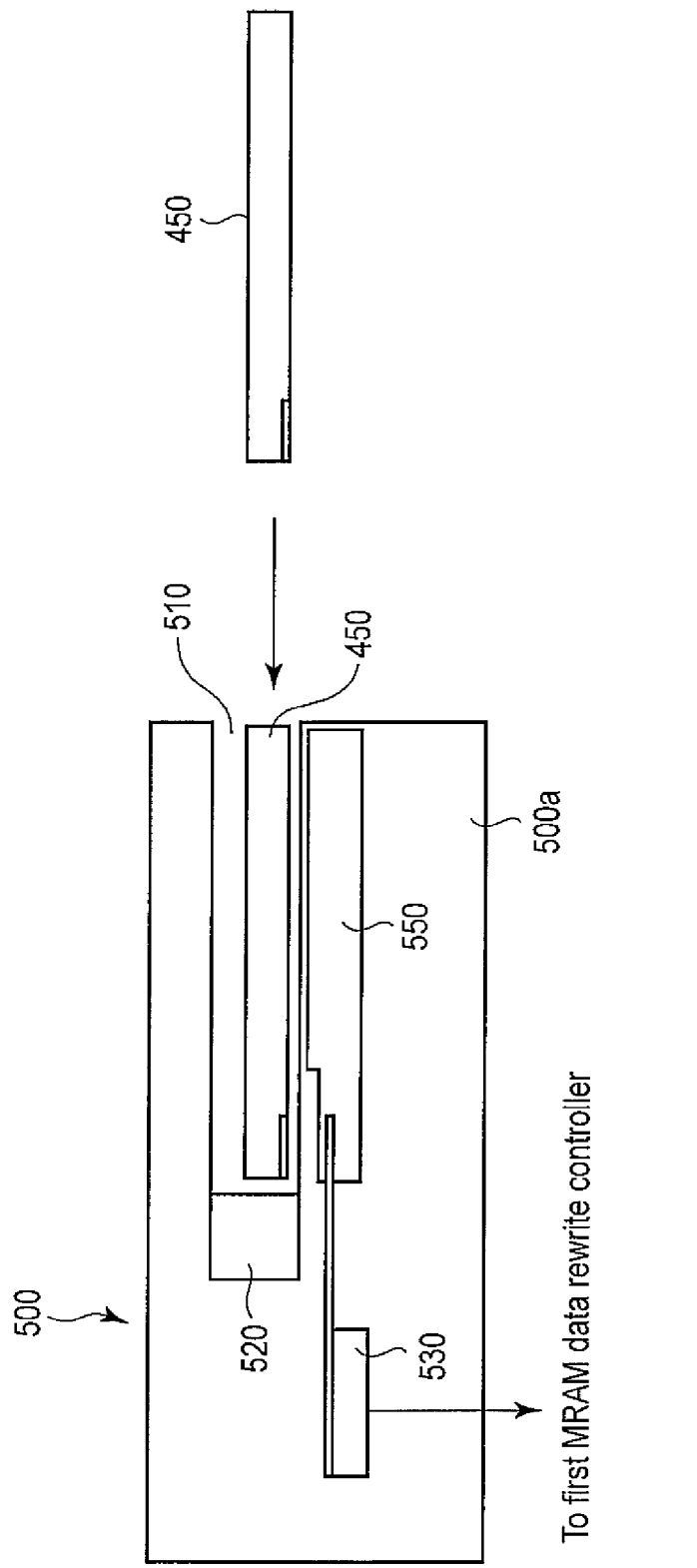
F I G. 14

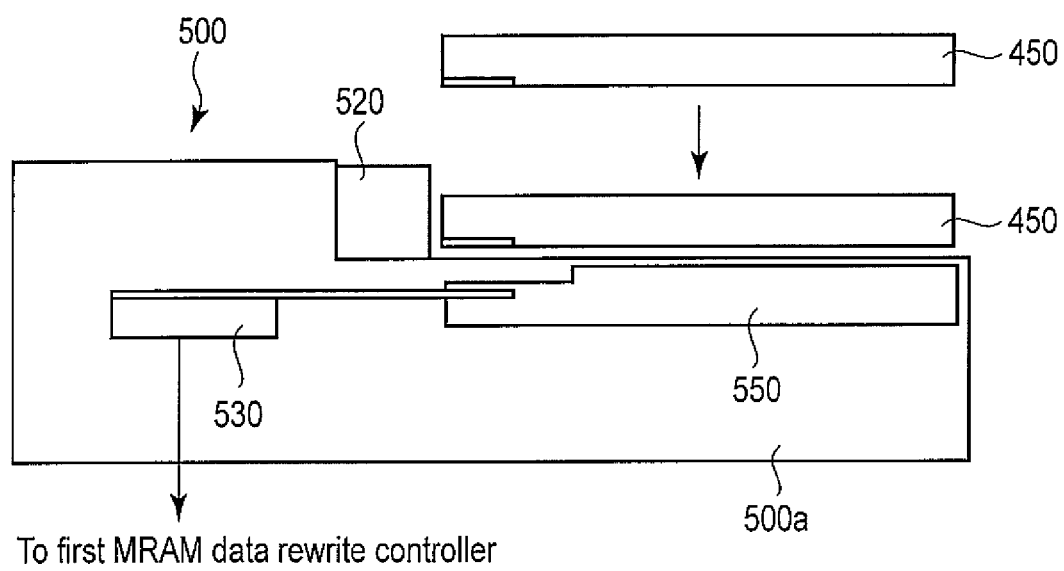
F I G. 15

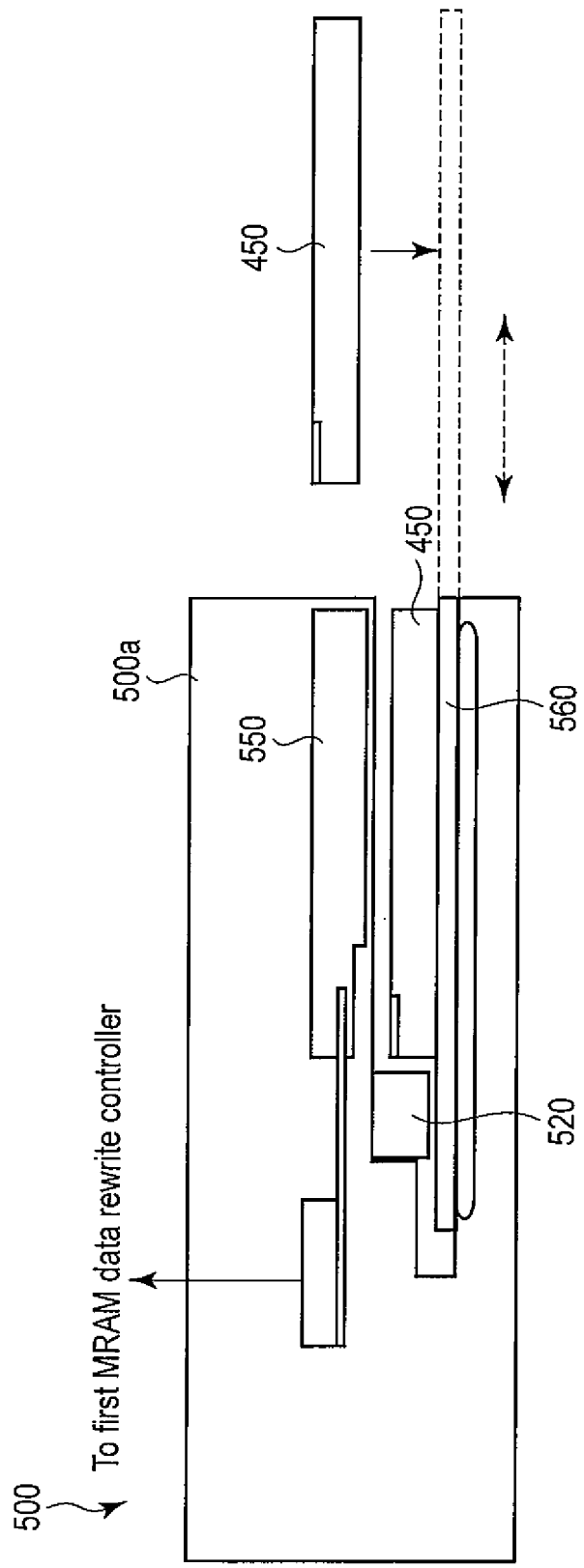
F I G. 16

MAGNETORESISTIVE ELEMENT AND MAGNETIC MEMORY

CROSS-REFERENCE TO RELATED APPLICATIONS

This application is based upon and claims the benefit of priority from prior Japanese Patent Application No. 2011-146718, filed Jun. 30, 2011, the entire contents of which are incorporated herein by reference.

FIELD

Embodiments described herein relate generally to a magnetoresistive element and a magnetic memory.

BACKGROUND

A magnetoresistive element has, as a basic structure, a laminate structure including a magnetic layer (a reference layer) having an invariable magnetization, a magnetic layer (a storage layer) having a variable magnetization, and a nonmagnetic layer between the magnetic layers, and is used in a memory cell of a magnetic random access memory, or an LSI of a spin field effect transistor (FET) of a reconfigurable logic circuit or the like. In this case, the magnetoresistive element is patterned in a pillar state.

Moreover, as a problem inherent in the magnetoresistive element, there is a phenomenon where a magnetic hysteresis curve of the storage layer shifts in a predetermined direction from a curve when the stray magnetic field is not present owing to an influence of a magnetic field (a stray magnetic field) which occurs by the magnetization of the reference layer. To return this curve to the original state, a shift adjustment layer for canceling the stray magnetic field needs to be added to the magnetoresistive element.

However, in recent years, a write system by spin injection, a perpendicular magnetization type magnetoresistive element and the like have been developed. Accordingly, the miniaturization of the magnetoresistive element has rapidly proceeded. When the magnetoresistive element is miniaturized, the stray magnetic field becomes large in proportion to the miniaturization. Therefore, even when the shift adjustment layer is finally thickly formed, it becomes difficult to return the magnetic hysteresis curve of the storage layer to the original state when the stray magnetic field is not present.

BRIEF DESCRIPTION OF THE DRAWINGS

FIGS. 1 to 3 are diagrams showing magnetoresistive elements;

FIG. 11 is a diagram showing a cellular phone terminal as another application example;

FIGS. 13 to 16 are diagrams showing a transfer device which transfers data to the MRAM card.

DETAILED DESCRIPTION

Figure 1:
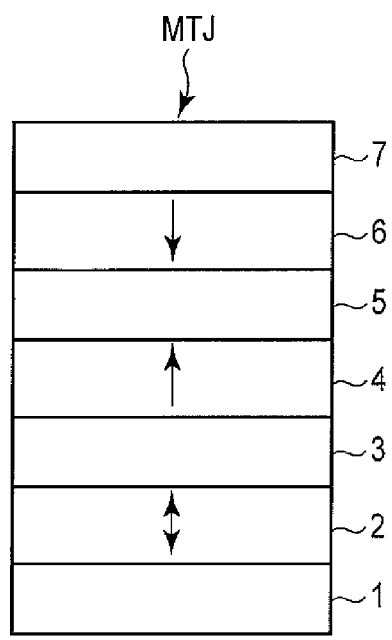

In general, according to one embodiment, a magnetoresistive element comprising: a storage layer having a perpendicular and variable magnetization; a reference layer having a perpendicular and invariable magnetization; a shift adjustment layer having a perpendicular and invariable magnetization in a direction opposite to a magnetization of the reference layer; a first nonmagnetic layer between the storage layer and the reference layer; and a second nonmagnetic layer between the reference layer and the shift adjustment layer, wherein a switching magnetic field of the reference layer is equal to or smaller than a switching magnetic field of the storage layer, and a magnetic relaxation constant of the reference layer is larger than a magnetic relaxation constant of the storage layer.

Embodiments of the magnetoresistive element and a magnetic memory will be described.

In the following description, constitutional elements having substantially the same function and constitution are denoted with the same sign, and the description will be repeated only when necessary. Moreover, the drawings are schematic, and a relation between a thickness and a planar dimension, a ratio of the thicknesses of layers and the like are different from actualities sometimes. Therefore, specific thicknesses or dimensions should be judged in consideration of the following description. Also among the drawings, a mutual dimensional relation, ratio and the like vary sometimes.

Moreover, the following embodiments are the illustrations of an apparatus and a method for embodying a technical idea. In this technical idea, materials, shapes, structures, arrangements and the like of constitutional components are not specified as follows. Various changes can be added to this technical idea in the patent claims.

In the following description, representations peculiar to the magnetoresistive element and the magnetic memory according to this technical idea are used sometimes, and hence representatives thereof will be defined as follows. Moreover, the representations which are not defined as follows will suitably be defined in the description of the embodiments.

The magnetoresistive element described hereinafter includes, as basic constitutional elements, a storage layer having a perpendicular and variable magnetization, a reference layer having a perpendicular and invariable magnetization, a shift adjustment layer having a perpendicular and invariable magnetization in a direction opposite to the magnetization of the reference layer, a nonmagnetic layer between the storage layer and the reference layer, and a nonmagnetic layer between the reference layer and the shift adjustment layer.

Here, the storage layer is a magnetic layer having a variable magnetization, and the reference layer is a magnetic layer having an invariable magnetization. The variable means that a residual magnetization of the magnetic layer can reverse in first and second directions which are opposite to each other, and the invariable means that the residual magnetization of the magnetic layer is constantly directed to one of the first and second directions.

The mutually opposite directions include a case where angle θ formed by the first and second directions is a range of $90° < \theta \leq 180°$. However, a magnetization direction of the residual magnetization of the storage layer can preferably reverse substantially by 180°.

The shift adjustment layer is a magnetic layer having a magnetization in the direction opposite to the magnetization of the reference layer. The shift adjustment layer has a purpose of adjusting the shift of a magnetic hysteresis curve of the storage layer.

The perpendicular magnetization means that the magnetization direction of the residual magnetization of the magnetic layer becomes perpendicular or substantially perpendicular to a film surface (an upper surface/a lower surface) of the magnetic layer. In this description, the substantially perpendicular means that the magnetization direction of the residual magnetization of the magnetic layer is in a range of $45°<\theta\leq90°$ with respect to the film surface of the magnetic layer.

(Magnetoresistive Element)

(1) Structure of Magnetoresistive Element

Figure 2:
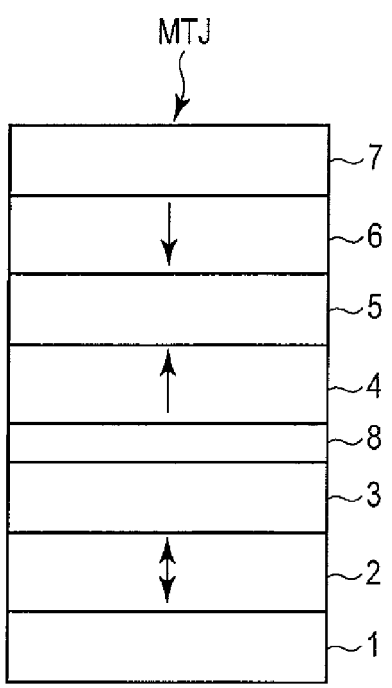

FIG. 1 to FIG. 3 show the magnetoresistive elements.

In the diagrams, arrows indicate magnetization directions. Magnetoresistive element MTJ is an element which produces, for example, a tunneling magneto-resistance effect (the TMR effect). Hereinafter, a main part of the magnetoresistive element will be described. When the main part includes shown elements, further elements may be included in addition to the shown elements.

Magnetoresistive element MTJ has a top pin structure where reference layer 4 is disposed above storage layer 2. In the present example, the top pin structure is described, but magnetoresistive element MTJ may have a bottom pin structure where reference layer 4 is disposed below storage layer 2.

Underlayer 1 is disposed for the purpose of controlling crystalline properties such as crystal orientations and grain sizes of layers which are present above storage layer 2.

Storage layer 2 is disposed on underlayer 1. Nonmagnetic layer 3 is disposed on storage layer 2. Nonmagnetic layer 3 is generally an insulating layer (e.g., an oxide layer). In this case, nonmagnetic layer 3 is called a tunnel barrier layer. Reference layer 4 is disposed on nonmagnetic layer 3.

Storage layer 2 and reference layer 4 have a perpendicular magnetization. That is, storage layer 2 and reference layer 4 have an easy axis of magnetization in a direction perpendicular to the film surface. In general, a coercive force of reference layer 4 is larger than that of storage layer 2. In the diagram, the magnetization direction of reference layer 4 is upward from the film surface, but may be downward to the film surface.

Nonmagnetic layer 5 is disposed on reference layer 4. Shift adjustment layer 6 is disposed on nonmagnetic layer 5. Shift adjustment layer 6 has an invariable magnetization in a direction opposite to the magnetization of reference layer 4. Cap layer 7 is disposed on shift adjustment layer 6. Cap layer 7 functions as a hard mask when magnetoresistive element MTJ is patterned, and the cap layer further functions as a protective layer for the purpose of preventing the oxidation of storage layer 2, reference layer 4 and shift adjustment layer 6.

It is to be noted that in the structure of FIG. 2, interface layer 8 is further interposed between nonmagnetic layer 3 and reference layer 4. Interface layer 8 is a magnetic layer for the purpose of relaxing lattice mismatch in an interface between nonmagnetic layer 3 and reference layer 4. Moreover, when interface layer 8 is a material having a high polarization ratio, a high TMR ratio and a high spin injection efficiency can be realized.

Moreover, in a structure of FIG. 3, interface layer 8 is further interposed between nonmagnetic layer 3 and reference layer 4, and interface layer 9 is interposed between storage layer 2 and nonmagnetic layer 3. Interface layers 8 and 9 are both magnetic layers for the purpose of relaxing the lattice mismatch in the interface between nonmagnetic layer 3 and reference layer 4 and an interface between storage layer 2 and nonmagnetic layer 3. Moreover, when interface layers 8 and 9 are materials having a high polarization ratio, the high TMR ratio and the high spin injection efficiency can be realized.

In FIG. 3, interface layer 8 can be omitted. In this case, interface layer 9 is disposed only on the interface between storage layer 2 and nonmagnetic layer 3.

Writing is performed in the magnetoresistive element MTJ by, for example, a spin injection magnetization reversal system. That is, the writing is performed by allowing a spin-polarized current (a bidirectional current) to flow through the layers in magnetoresistive element MTJ in a direction perpendicular to the film surfaces of the layers.

For example, when the spin-polarized current flows from storage layer 2 to reference layer 4, an electron of reference layer 4 in which spin information is accumulated is injected from reference layer 4 to storage layer 2. A spin angular momentum of this electron has an influence on the electron of storage layer 2 in accordance with the conservation law of the spin angular momentum, whereby the magnetization of storage layer 2 changes to be parallel.

Moreover, when the spin-polarized current flows from reference layer 4 to storage layer 2, the electron in which the spin information obtained by reversing the spin information of storage layer 2 is accumulated is injected from reference layer 4 to storage layer 2. The spin angular momentum of this electron has an influence on the electron of storage layer 2 in accordance with the conservation law of the spin angular momentum, whereby the magnetization of storage layer 2 changes to be antiparallel.

According to this principle, a relative angle of the magnetization directions of the residual magnetizations of storage layer 2 and reference layer 4 can be changed to be parallel (a state where the relative angle is 0° or substantially 0°) or antiparallel (a state where the relative angle is 180° or substantially 180°).

It is to be noted that the parallel is a state where the residual magnetizations of storage layer 2 and reference layer 4 have the same direction. For example, in this case, a resistance value of magnetoresistive element MTJ becomes a minimum value. On the other hand, the antiparallel is a state where the residual magnetizations of storage layer 2 and reference layer 4 have opposite directions. For example, in this case, the resistance value of magnetoresistive element MTJ becomes a maximum value.

Therefore, when the change (the minimum value/the maximum value) of the resistance value of magnetoresistive element MTJ is associated with "0"/"1" of binary data, the binary data can be stored in magnetoresistive element MTJ.

(2) Reference Layer

Hereinafter, properties and a material of the reference layer will be described.

(2-1) Properties of Reference Layer

Conditions of reference layers 4 of magnetoresistive elements MTJ of FIG. 1 to FIG. 3 lie in that the magnetization direction does not easily change as compared with storage layer 2, and a stray magnetic field to storage layer 2 is small. Therefore, reference layer 4 is preferably constituted of a material in which effective magnetic anisotropy $K_u^{eff}$, coercive force Hc and magnetic relaxation constant $\alpha$ are large, and saturated magnetization $M_s$ is small.

However, as a size of magnetoresistive element MTJ becomes small, the stray magnetic field from reference layer 4 to storage layer 2 becomes large. When a shift of a magnetic hysteresis curve of storage layer 2 due to this stray magnetic field is canceled by shift adjustment layer 6, it is necessary to make reference layer 4 as thin as possible. This is because the larger a thickness of reference layer 4 is, the larger a distance between storage layer 2 and shift adjustment layer 6 becomes. Therefore, it becomes difficult to adjust the magnetic hysteresis curve of storage layer 2 by shift adjustment layer 6.

However, when reference layer 4 is made thin, effective magnetic anisotropy $K_u^{eff}$ usually becomes small for the following reason.

For example, effective magnetic anisotropy $K_u^{eff}$ of the magnetic layer having the perpendicular magnetization is represented as follows $$K_u^{eff}(\propto M_s \cdot H_c/2)=K_u^{int}-K_d,$$

in which by $K_u^{int}$ is an intrinsic magnetic anisotropy of a material, and $K_d$ is a magnetic anisotropy due to a material shape.

That is, when reference layer 4 is made thin, $K_u^{int}$ lowers owing to the deterioration of a film quality, and $K_d$ increases. Therefore, effective magnetic anisotropy $K_u^{eff}$, and coercive force (a switching magnetic field) Hc lowers.

Figure 4:
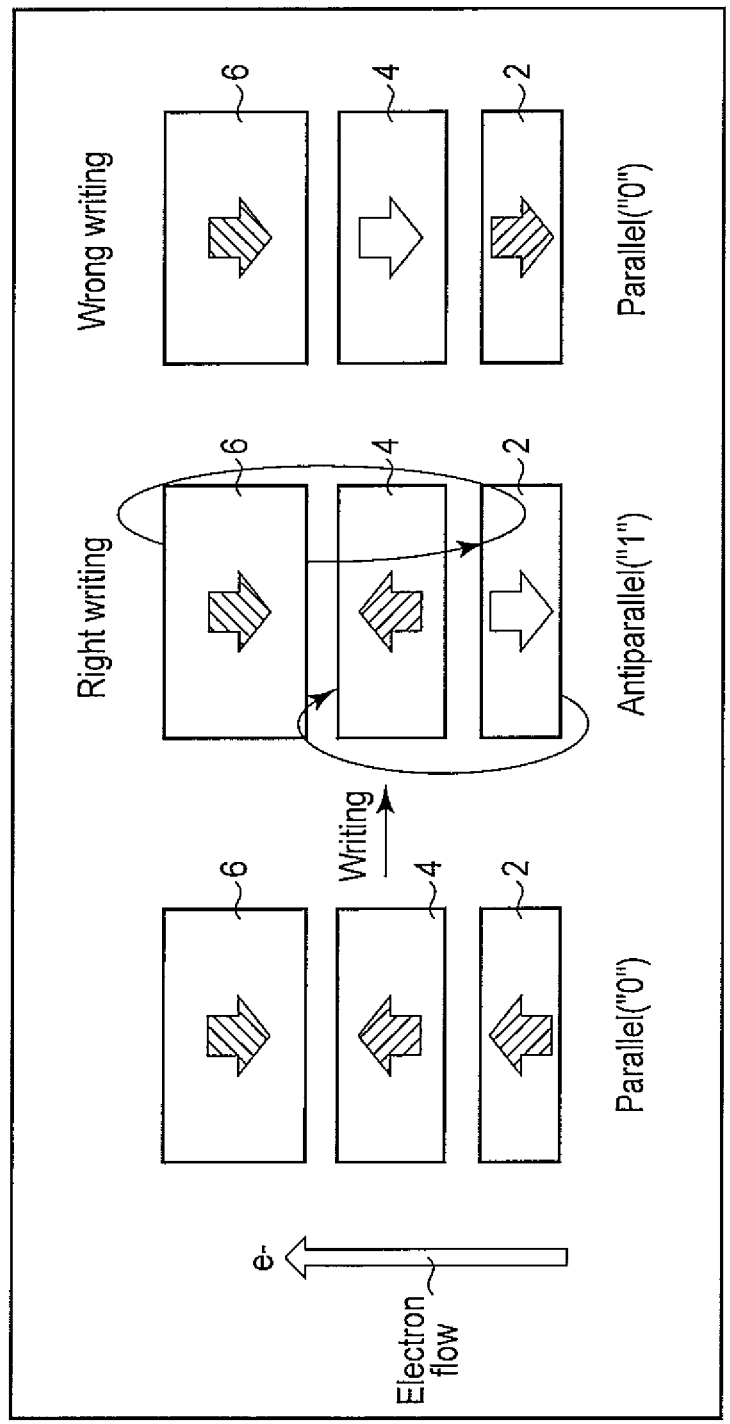
FIG. 4 is a diagram for explaining a problem when a reference layer is made thin.

In consequence, as shown in FIG. 4, reference layer 4 receives the stray magnetic field from storage layer 2 and shift adjustment layer 6. Therefore, a problem occurs that when reference layer 4 is thin, it becomes difficult to make the magnetization of reference layer 4 invariable.

Specifically, in writing to change storage layer 2 from the parallel magnetization to the antiparallel magnetization, right writing is an operation of reversing the only magnetization direction of storage layer 2, but wrong writing easily occurs in which both the magnetization directions of storage layer 2 and reference layer 4 reverse.

This is because when reference layer 4 becomes thin, an energy barrier of reference layer 4 becomes low, and a write margin cannot sufficiently be acquired between an energy barrier of storage layer 2 and the energy barrier of reference layer 4.

In particular, since reference layer 4 is thin, the switching magnetic field of reference layer 4 becomes equal to or smaller than that of storage layer 2 sometimes. In this case, also in a spin injection write system, when the magnetization of storage layer 2 is directed opposite to that of reference layer 4 (parallel→antiparallel), the magnetization of reference layer 4 simultaneously reverses also. In consequence, the magnetization of storage layer 2 cannot be directed opposite to that of reference layer 4.

There has been suggested a technology for forming reference layer 4 as a thin film without causing such a problem of wrong writing, i.e., a technology for more securely canceling, by the shift adjustment layer, the stray magnetic field which increases in accordance with the miniaturization of the magnetoresistive element as follows.

In conclusion, conditions on which the above wrong writing is not caused even when reference layer 4 is thin have been suggested from the viewpoint of the magnetic relaxation constants of storage layer 2 and reference layer 4. That is, in the magnetoresistive element of the embodiment, the magnetic relaxation constant of reference layer 4 is larger than that of storage layer 2. In this case, for example, even when reference layer 4 is formed ash thin film and the switching magnetic field of reference layer 4 becomes equal to or smaller than that of storage layer 2, the write margin can sufficiently be acquired between the energy barrier of storage layer 2 and the energy barrier of reference layer 4. Therefore, the above wrong writing does not occur. In consequence, the stray magnetic field from reference layer 4 can securely be cancelled by the shift adjustment layer.

Hereinafter, the magnetic relaxation constants of storage layer 2 and reference layer 4 will be verified by Landaw-Lifshitz-Gilbert (LLG) equation.

In general, critical current $I_c$ when magnetization reversal by the spin injection writing is performed on the magnetoresistive element having the perpendicular magnetization is represented as follows.

$$Ic \propto \alpha/\eta \cdot \Delta \quad \text{(Formula 1)},$$

in which α: magnetic relaxation constant, and
η: spin injection efficiency coefficient.

Δ is a thermal disturbance index, and represented by obtaining a ratio between effective anisotropy energy $K_u^{eff} \cdot V$ and heat energy $k_B T$ as follows.

$$\Delta = K_u^{eff} \cdot V/k_B T$$

$$\propto M_s \cdot H_c/2 \cdot Va/k_B T \quad \text{(Formula 2)},$$

in which $K_u^{eff}$: perpendicular magnetic anisotropy constant;
$H_c$: coercive force;
$M_s$: saturated magnetization;
N: demagnetization coefficient; and
Va: unit volume of magnetization reversal.

When reference layer 4 is formed as the thin film as described above, coercive force Hc lowers owing to the deterioration of the magnetic anisotropy. Moreover, when the magnetization of storage layer 2 is changed from the parallel direction to the antiparallel direction by the stray magnetic field from storage layer 2 and shift adjustment layer 6, the magnetization direction of reference layer 4 might also reverse. That is, when the switching magnetic field of reference layer 4 lowers and the magnetic relaxation constant of storage layer 2 is equal to or larger than that of reference layer 4, a switching current difference between storage layer 2 and reference layer 4 becomes small. In consequence, the write margin decreases, and the wrong writing occurs.

To avoid such a problem, the magnetic relaxation constant of reference layer 4 may be larger than that of storage layer 2. Moreover, even when the stray magnetic field gradually becomes large in accordance with the miniaturization of the magnetoresistive element, a difference in magnetic relaxation constant between reference layer 4 and storage layer 2 is gradually increased, so that it is possible to sufficiently cope with the miniaturization of the magnetoresistive element.

Figure 5:
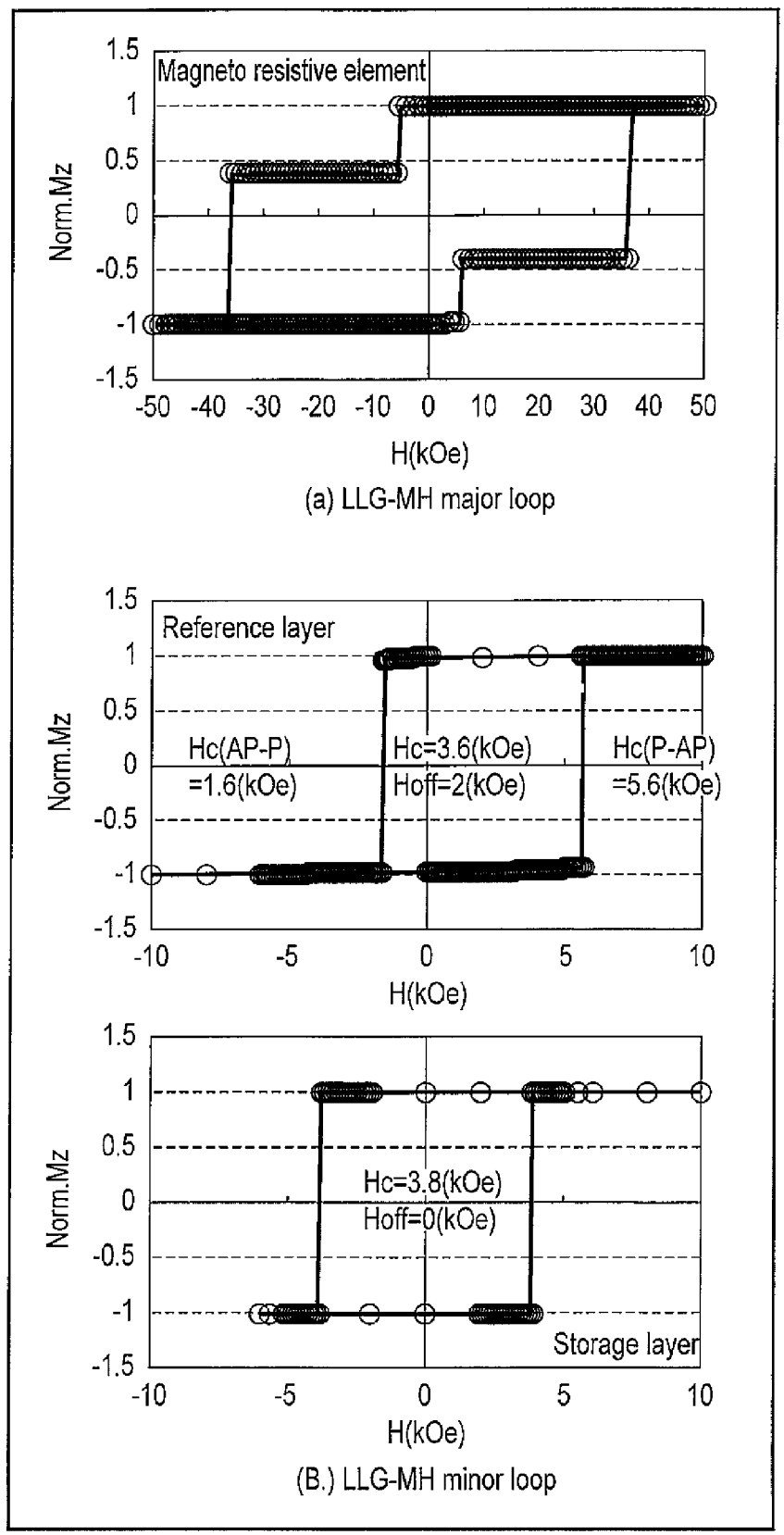
FIG. 5 is a diagram showing an MH loop when a coercive force of the reference layer is equal to that of a storage layer.

FIG. 5 shows MH curves.

In the diagrams, it is assumed that the coercive force (the switching magnetic field) of the reference layer is equal to or smaller than that of the storage layer. At this time, the stray magnetic field from the reference layer which is applied to the storage layer is canceled by the shift adjustment layer, but in the reference layer, a switching magnetic field shifts owing to the stray magnetic field from the storage layer and the shift adjustment layer.

When the switching magnetic field of the reference layer shifts and the magnetization of the storage layer changes from the parallel direction to the antiparallel direction, the magnetization direction of the reference layer might reverse.

Figure 6:
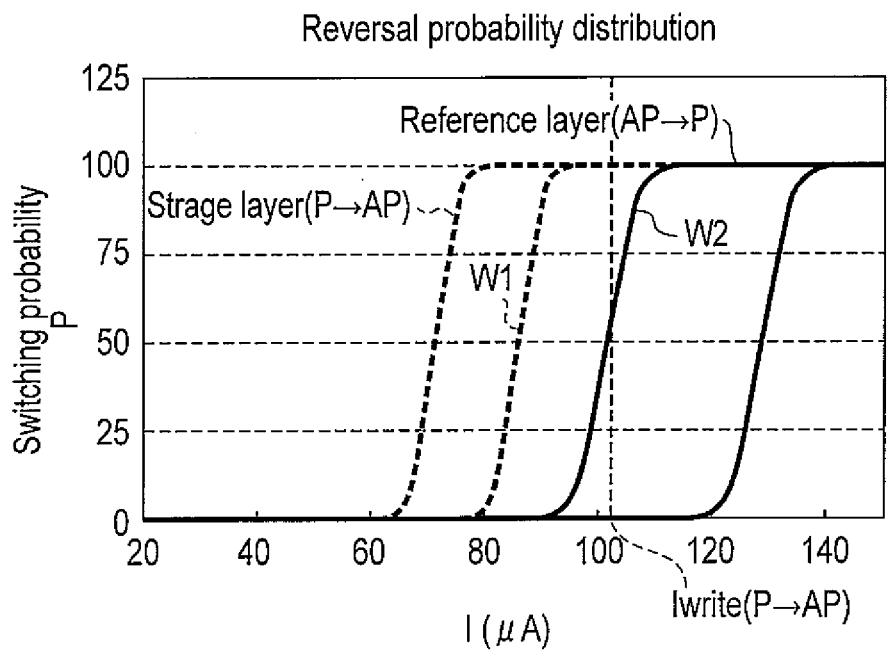
FIGS. 6 and 7 are diagrams showing magnetization reversal probability distributions of the storage layer and the reference layer.
Figure 7:
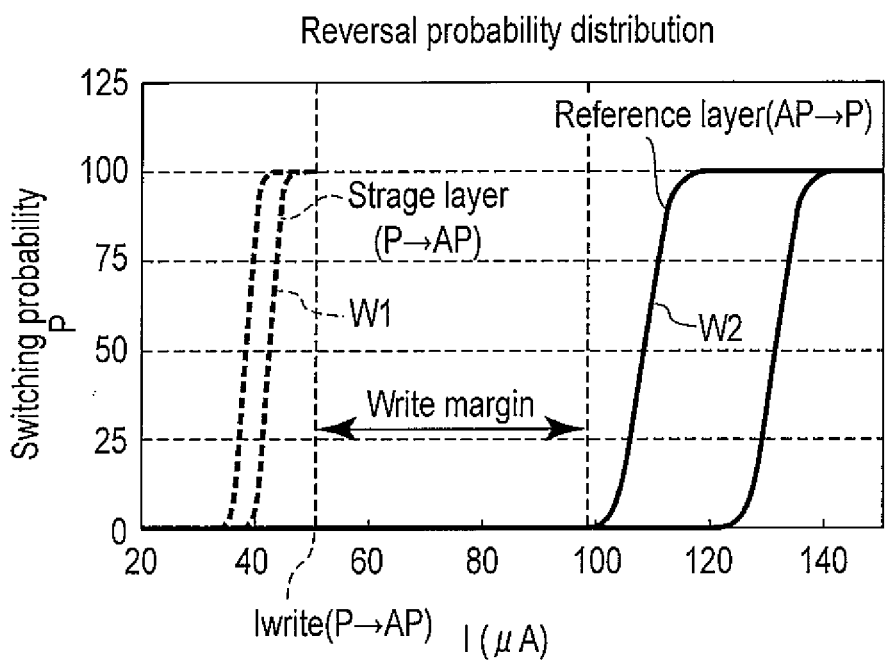

Therefore, it will be verified with reference to FIG. 6 and FIG. 7 how the magnetic relaxation constants of the storage layer and the reference layer are set so that the magnetization reversal of the reference layer does not occur.

FIG. 6 shows a first example of a reversal probability distribution of the magnetic layer.

This example is the magnetization reversal probability distribution when the magnetic relaxation constant of the storage layer is 0.05 and the magnetic relaxation constant of the reference layer is 0.02, i.e., when the magnetic relaxation constant of the storage layer is larger than that of the reference layer.

According to the diagram, the reversal probability when the storage layer changes from the parallel direction to the antiparallel direction (P→AP) is seen at worst bit W1. In this case, when current I flowing through the storage layer is about 90 (μA), the probability is 100%. Therefore, write current Iwrite (P→AP) when the storage layer changes from the parallel direction to the antiparallel direction is set to, for example, around 100 (μA) in consideration of the margin.

However, the reversal probability when the reference layer reverses (AP→P) is seen at worst bit W2. In this case, when current I flowing through the reference layer is around 100 (μA), the probability is about 50%. Consequently, for changing the storage layer from the parallel direction to the antiparallel direction, for example, around 100 (μA) flows as write current Iwrite (P→AP) through the magnetoresistive element. In this case, the magnetization of the reference layer also reverses sometimes.

It is seen that when the magnetic relaxation constant of the storage layer is larger than that of the reference layer in this manner, the write margin cannot be acquired.

FIG. 7 shows a second example of the reversal probability distribution of the magnetic layer.

This example is the magnetization reversal probability distribution when the magnetic relaxation constant of the storage layer is 0.05 and the magnetic relaxation constant of the reference layer is 0.05, i.e., when the magnetic relaxation constant of the reference layer is equal to that of the storage layer.

According to the diagram, the reversal probability when the storage layer changes from the parallel direction to the antiparallel direction (P→AP) is seen at worst bit W1. In this case, when current I flowing through the storage layer is about 30 (μA), the probability is 0%. When the current is about 45 (μA), the probability is 100%. Therefore, write current Iwrite (P→AP) when the storage layer changes from the parallel direction to the antiparallel direction is set to, for example, around 50 (μA) in consideration of the margin.

On the other hand, the reversal probability when the reference layer reverses (AP→P) is seen at worst bit W2. In this case, when current I flowing through the reference layer is around 90 (μA), the probability is 0%. Consequently, for changing the storage layer from the parallel direction to the antiparallel direction, for example, around 50 (μA) flows as write current Iwrite (P→AP) through the magnetoresistive element. However, the magnetization of the reference layer does not reverse.

It is to be noted that the write margin between write current Iwrite (P→AP) and the maximum current at which the reversal probability of the reference layer (the worst bit) is 0% becomes large, when the magnetic relaxation constant of the reference layer is larger than that of the storage layer. The larger a difference between the constants is, the larger the margin becomes. However, a structure (a thickness of each layer or the like) of the magnetoresistive element is predetermined.

It is seen that when the magnetic relaxation constant of the reference layer is equal to or larger than that of the storage layer in this manner, the write margin can sufficiently be acquired.

(2-2) Material of Reference Layer

The reference layer is preferably constituted of a material in which effective magnetic anisotropy $K_u^{eff}$, coercive force Hc and magnetic relaxation constant α are large, and saturated magnetization $M_s$ is small, as described above. Such a material can suitably be selected from the following materials.

(2-2-1) Artificial Lattice Series

An artificial lattice series is a structure where an alloy (a magnetic layer) containing at least one element of Fe, Co and Ni and an alloy (a nonmagnetic layer) containing at least one element of Cr, Pt, Pd, Ir, Rh, Ru, Os, Re, Au and Cu are alternately laminated.

Examples of the artificial lattice series include Co/Pt artificial lattice, Co/Pd artificial lattice, CoCr/Pt artificial lattice, Co/Ru artificial lattice, Co/Os, Co/Au, and Ni/Cu artificial lattice. Moreover, examples of the artificial lattice series using two magnetic layers can include Co/Ni artificial lattice, and Fe/Ni artificial lattice.

In these artificial lattice series, when a film thickness ratio of the magnetic layer to the nonmagnetic layer (e.g., a tunnel barrier layer) is small, effective magnetic anisotropy $K_u^{eff}$ can become large, and saturated magnetization $M_s$ can become small. Moreover, when a lamination cycle of the magnetic layer is increased, the magnetic anisotropy due to the shape decreases, and hence effective magnetic anisotropy $K_u^{eff}$ can become large.

For example, to increase the magnetic relaxation constant α, there may be used a reference layer in which the magnetic layer/the nonmagnetic layer are combined so that the number of electrons of d-track is large and a spin-track interaction becomes large, or there may be used a cap layer in which the number of the electrons of d-track is large and the spin-track interaction becomes large. Examples of a material which can constitute such a cap layer include Pt and Pd.

(2-2-2) Rare Earth Metal (RE)-Transition Metal (TM) Alloy Series

RE-TM alloy series is an alloy of a rare earth metal and a transition metal. The RE-TM alloy series becomes one of a ferri-magnetic material and a ferromagnetic material in accordance with a material of the rare earth metal.

Examples of the ferri-magnetic material include an alloy containing at least one of terbium (Tb), dysprosium (Dy) and gadolinium (Gd) and at least one of Fe, Co and Ni.

Examples of the ferri-magnetic material can include TbFe, TbCo, TbFeCo, DyTbFeCo and GdTbCo.

In these alloys, the magnetization directions of the rare earth metal and the transition metal combine in an antiferromagnetic manner, and a composition (a compensation point composition) in which the saturated magnetization becomes 0 is present ((e.g., in TbCoFe, around Tb=80 (vol %)). In the vicinity of the compensation point composition, coercive force Hc increases in accordance with the decrease of the saturated magnetization. Therefore, when the composition is adjusted in the vicinity of the compensation point, it is possible to adjust effective magnetic anisotropy $K_u^{eff}$, saturated magnetization $M_s$ and magnetic relaxation constant α.

Examples of the ferromagnetic material include an alloy containing at least one of samarium (Sm), neodymium (Nd) and holmium (Ho) and containing at least one of Fe, Co and Ni.

Examples of the ferromagnetic material can include $SmCo_5$ and NdFeB.

When a composition ratio of these alloys is adjusted, it is possible to adjust effective magnetic anisotropy $K_u^{eff}$, saturated magnetization $M_s$ and magnetic relaxation constant α.

When the above material series is used as the reference layer, the reference layer has a large lattice mismatch with the nonmagnetic layer (e.g., the tunnel barrier layer), which is not preferable from the viewpoint of realizing the high TMR ratio. Therefore, in such a case, an interface layer is interposed between the reference layer and the nonmagnetic layer as described above.

(3) Storage Layer

Hereinafter, properties and a material of the storage layer will be described.

Conditions of storage layers 2 of magnetoresistive elements MTJ of FIG. 1 to FIG. 3 lie in that an element size is small, and a resistance to thermal disturbance can be maintained owing to a large perpendicular magnetic anisotropy. In consequence, the miniaturization of magnetoresistive element MTJ is not easily compatible with the writing with a low current.

(3-1) Properties of Storage Layer

When the storage layer has a perpendicular magnetization, thermal disturbance index $\Delta$ of the storage layer usually has required conditions of $\Delta > 60$ for avoiding a problem that the magnetization fluctuates owing to heat energy (thermal disturbance).

However, when the size of magnetoresistive element MTJ becomes small and the storage layer becomes thin, unit volume Va of magnetization reversal becomes small. Therefore, when heat is applied to the storage layer, a state of the residual magnetization of the storage layer cannot be maintained. A storage operation by the storage layer becomes unstable (the thermal disturbance).

Therefore, the storage layer is preferably constituted of a material in which effective magnetic anisotropy constant $K_u^{eff}$ is large. Further in the storage layer, saturated magnetization $M_s$ is preferably small.

(3-2) Material of Storage Layer

The storage layer can suitably be selected from the following materials.

(3-2-1) CoFe—X Series

CoFe—X series is CoFe (an amorphous alloy) to which B, C, N and the like are added. That is, X is at least one of B, C and N.

The CoFe—X series has excellent lattice matching properties with the nonmagnetic layer having NaCl structure (e.g., the tunnel barrier layer) after a heat treatment, and the high TMR ratio can be realized.

In particular, the storage layer is preferably an alloy containing Co, Fe and B, i.e., $(Co_{100-x}Fe_x)_{100-y}B_y$ ($x \geq 25$ at %, and $0 \leq y \leq 30$ at %) from the viewpoint of preferential orientation with a (100) face. Moreover, the CoFe—X series may further contain at least one of Ta, W, Hf, Zr, Nb, Mo, Ti, V and Cr having a high melting point.

For example, when Ta is used in the nonmagnetic layer, CoFeB is used in the magnetic layer and both the layers are brought into contact with each other, B in CoFeB is attracted by Ta after the heat treatment, and hence the crystallization of the magnetic layer in the vicinity of the nonmagnetic layer is promoted.

(3-2-2) Ordered Alloy Series

An ordered alloy series is an alloy containing at least one of Fe, Co and Ni, and at least one of Pt and Pd. A crystal structure of the ordered alloy series is preferably $L1_0$ type. Examples of the ordered alloy series can include $Fe_{50}Pt_{50}$, $Fe_{50}Pd_{50}$, $Co_{50}Pt_{50}$, $Fe_{30}Ni_{20}Pt_{50}$, $Co_{30}Fe_{20}Pt_{50}$ and $Co_{30}Ni_{20}Pt_{50}$. The ordered alloy series is not limited to the above composition ratio.

Moreover, when impurities such as copper (Cu), chromium (Cr) and silver (Ag), an alloy thereof or an insulator thereof is added to the ordered alloy series, it is possible to adjust effective magnetic anisotropy $K_u^{eff}$ and saturated magnetization $M_s$ of the storage layer.

When the ordered alloy series is used as the storage layer and a lattice mismatch between the storage layer and the nonmagnetic layer (e.g., the tunnel barrier layer) is large, an interface layer is preferably interposed between the storage layer and the nonmagnetic layer.

(3-2-3) Artificial Lattice Series

An artificial lattice series is a structure where an alloy containing at least one of Fe, Co and Ni and an alloy containing at least one of Cr, Pt, Pd, Ir, Rh, Ru, Os, Re, Au and Cu are alternately laminated. Examples of the artificial lattice series can include Co/Pt artificial lattice, Co/Pd artificial lattice, CoCr/Pt artificial lattice, Co/Ru artificial lattice, Co/Os, Co/Au, and Ni/Cu artificial lattice.

In the artificial lattice series, when an element is added to the magnetic layer to decrease a film thickness ratio of the magnetic layer to the nonmagnetic layer (e.g., the tunnel barrier layer), effective magnetic anisotropy $K_u^{eff}$ can become large, and saturated magnetization $M_s$ can become small.

Moreover, when the artificial lattice series is used as the storage layer, the lattice mismatch with the nonmagnetic layer (e.g., the tunnel barrier layer) is large, which is not preferable from the viewpoint of maintaining the high TMR ratio. Therefore, in such a case, the interface layer is preferably interposed between the nonmagnetic layer and the storage layer.

(3-2-4) Disordered Alloy Series

A disordered alloy series is a metal containing cobalt (Co) as a main component and containing at least one of chromium (Cr), tantalum (Ta), niobium (Nb), vanadium (V), tungsten (W), hafnium (Hf), titanium (Ti), zirconium (Zr), platinum (Pt), palladium (Pd), iron (Fe) and nickel (Ni).

Examples of the disordered alloy series can include CoCr alloy, CoPt alloy, CoCrPt alloy, CoCrPtTa alloy and CoCrNb alloy.

In the disordered alloy series, when a percentage of a nonmagnetic element is increased, effective magnetic anisotropy $K_u^{eff}$ can become large, and saturated magnetization $M_s$ can become small.

Moreover, when the disordered alloy series is used as the storage layer, the lattice mismatch with the nonmagnetic layer (e.g., the tunnel barrier layer) is large, which is not preferable from the viewpoint of maintaining the high TMR ratio. Therefore, in such a case, the interface layer is preferably interposed between the nonmagnetic layer and the storage layer.

(4) Underlayer

For a structure where the storage layer and the reference layer have perpendicular magnetizations (a magnetic film having an easy axis of magnetization in a direction perpendicular to a film face), an underlayer is usually required.

For example, when the storage layer is constituted of the ordered alloy series, artificial lattice series or disordered alloy series, it is necessary to employ a structure where an atom dense face of the storage layer is easily oriented. That is, it is necessary to control crystal orientation of the storage layer so that an fcc (111) face or an hcp (001) face is oriented. Therefore, it is important to select the underlayer.

It is to be noted that when the storage layer is constituted of CoFe—X (amorphous alloy) series, CoFe—X has an interface magnetic anisotropy with the nonmagnetic layer (e.g., the tunnel barrier layer) as an origin of a perpendicular magnetic anisotropy. Therefore, the dense face does not necessarily have to be oriented in the underlayer.

(4-1) Material of Underlayer

As the underlayer, the following material can be selected, both when the storage layer is formed on the underlayer and when the reference layer is formed on the underlayer.

When as the magnetic layer (the storage layer or the reference layer) on the underlayer, artificial lattice series such as Co/Pt, Co/Pd or Co/Ni, fcc or hcp CoPd alloy or CoPt alloy, or RE-TM ordered alloy (e.g., Sm—Co or the like) is employed, the underlayer is preferably constituted of a metal having a dense structure.

Examples of the metal having the dense structure can include Pt, Pd, Ir and Ru. Moreover, the underlayer is not one element metal only, but may be an alloy containing two elements or more, for example, Pt—Pd or Pt—Ir.

However, these metals tend to increase magnetic relaxation constant α of the storage layer by a spin pumping effect, and hence it is preferable to use, as the underlayer, (a) Pt—Cu, Pd—Cu, Ir—Cu, Pt—Au, Ru—Au, Pt—Al, or Ir—Al which is an alloy of the above metal and an fcc metal such as Cu, Au or Al, (b) Pt—Re, Pt—Ti, Ru—Re, Ru—Ti, Ru—Zr, Ru—Hf, Al—Ti or Cu—Ti which is an alloy of the above metal and an hcp metal such as Re, Ti, Zr or Hf, or (c) an oxide or a nitride of the above (a) and (b).

That is, the underlayer is preferably constituted of a material in which the number of the electrons of d-track is small and a spin-track interaction is small. When such a material is used as the underlayer, a ratio of a metal such as Pt or Ir in which the number of the electrons of d-track is large can be lowered as much as possible, while keeping the dense structure. In consequence, it is possible to lower magnetic relaxation constant α of the storage layer.

Moreover, when the underlayer is excessively thick, the smoothness of magnetoresistive element MTJ deteriorates. Therefore, an upper limit of a thickness of the underlayer is preferably 30 nm.

It is to be noted that the underlayer may have a laminate structure of layers. This laminate structure has a purpose of laminating materials having different lattice constants to adjust the lattice constant.

For example, when the underlayer is provided with a laminate structure of an Ru layer and a Pt layer, the Pt layer is influenced by the Ru layer, and has a lattice constant which is different from a bulk lattice constant.

When the underlayer is provided with the laminate structure, a lowermost layer of the underlayer can include, for example, a Ta layer for the purpose of enhancing the smoothness and the crystal orientation of the other layers (the dense structure) of the underlayer. Moreover, the upper limit of the thickness of the underlayer is 10 nm, when time required to form the underlayer, i.e., the enhancement of productivity is taken into consideration. Moreover, a lower limit of the thickness of the underlayer is 1 nm, when the enhancement of the crystal orientation is taken into consideration.

Therefore, the thickness of the underlayer is preferably in a range of 1 to 10 nm.

It is to be noted that when the magnetic layer (the storage layer or the reference layer) on the underlayer is $L1_0$ rule alloy such as FePt or FePd, it is preferable to employ, as the underlayer, an fcc metal such as Pt or Pd in which the (100) face is oriented, a bcc metal such as Cr, or a compound such as TiN or MgO having NaCl structure.

Moreover, when the magnetic layer (the storage layer or the reference layer) on the underlayer is CoFe—X (amorphous alloy) series, the underlayer is preferably constituted of a material which also serves as a close contact layer, for example, Ta, W or the like.

(5) Nonmagnetic Layer

As the nonmagnetic layer interposed between the storage layer and the reference layer, an oxide having the NaCl structure is preferable. Specifically, the nonmagnetic layer includes one of MgO, CaO, SrO, TiO, VO, and NbO.

When the magnetization direction of the storage layer is antiparallel to that of the reference layer, a spin-polarized Δ1 band becomes a bearer of tunneling conduction, and hence an only majority spin electron contributes to electric conduction. In consequence, an electric conductivity of magnetoresistive element MTJ lowers, and the resistance value of magnetoresistive element MTJ becomes large.

On the other hand, when the magnetization direction of the storage layer is parallel to that of the reference layer, a Δ5 band which is not spin-polarized dominates the electric conduction. Therefore, the electric conductivity of magnetoresistive element MTJ rises, and the resistance value of magnetoresistive element MTJ becomes small. Consequently, the formation of the Δ1 band becomes a point for developing the high TMR ratio.

When the Δ1 band is formed, matching properties of the (100) face of the nonmagnetic layer containing the oxide of the NaCl structure with a face where the storage layer comes in contact with the nonmagnetic layer and a face where the reference layer comes in contact with the nonmagnetic layer have to be excellent.

Therefore, when lattice matching properties of the nonmagnetic layer (e.g., the oxide having the NaCl structure) in the (100) face are further improved, the interface layers may be interposed between the nonmagnetic layer and the storage layer and between the nonmagnetic layer and the reference layer, respectively.

From the viewpoint of forming the Δ1 band, a material in which a lattice mismatch in the (100) face of the nonmagnetic layer becomes 5% or smaller is preferably selected as the interface layer.

(6) Interface Layer

When the interface layers are interposed between the storage layer and the nonmagnetic layer and between the reference layer and the nonmagnetic layer in magnetoresistive element MTJ for the purpose of enhancing a magnetoresistance ratio (the TMR ratio), the interface layers are preferably constituted of a material having a high polarization ratio, for example, an alloy containing Co, Fe and B. As such a material, $(Co_{100-x}Fe_x)_{100-y}B_y$ (with the proviso that x≥50 at %, and 0≤y≤30 at %) is present. $(Co_{100-x}Fe_x)_{100-y}B_y$ is a high polarization-ratio material which relaxes lattice mismatches between the storage layer and the nonmagnetic layer and between the reference layer and the nonmagnetic layer, and hence the material has characteristics that the high TMR ratio and high spin injection efficiency can be realized.

(7) Shift Adjustment Layer

The shift adjustment layer has a magnetization in a direction opposite to the magnetization of the reference layer for the purpose of adjusting the shift of the magnetic hysteresis curve of the storage layer. Therefore, the shift adjustment layer can be constituted of the same material as the reference layer.

(7-1) Artificial Lattice Series

An artificial lattice series is a structure where an alloy (the magnetic layer) containing at least one of Fe, Co and Ni and an alloy (the nonmagnetic layer) containing at least one of Cr, Pt, Pd, Ir, Rh, Ru, Os, Re, Au and Cu are alternately laminated.

Examples of the artificial lattice series can include Co/Pt artificial lattice, Co/Pd artificial lattice, CoCr/Pt artificial lattice, Co/Ru artificial lattice, Co/Os, Co/Au, and Ni/Cu artificial lattice. Moreover, examples of the artificial lattice series using two magnetic layers can include Co/Ni artificial lattice, and Fe/Ni artificial lattice.

(7-2) Rare Earth Metal (RE)-Transition Metal (TM) Alloy Series

An RE-TM alloy series is an alloy of a rare earth metal and a transition metal. The RE-TM alloy series becomes one of a ferri-magnetic material and a ferromagnetic material in accordance with a material of the rare earth metal.

Examples of the ferri-magnetic material include an alloy containing at least one of terbium (Tb), dysprosium (Dy) and gadolinium (Gd) and at least one of Fe, Co and Ni.

Examples of the ferri-magnetic material can include TbFe, TbCo, TbFeCo, DyTbFeCo and GdTbCo.

Examples of the ferromagnetic material include an alloy containing at least one of samarium (Sm), neodymium (Nd) and holmium (Ho) and at least one of Fe, Co and Ni.

Examples of the ferromagnetic material can include $SmCo_5$ and NdFeB.

(Magnetic Memory)

In recent years, there has increased an interest in a magnetic random access memory (MRAM) utilizing a magnetoresistance effect of a ferromagnetic material, as a nonvolatile semiconductor memory of the next generation which enables high-speed read/write, a large capacity and an operation with small power consumption. In particular, it has been found that a magnetoresistive element including a ferromagnetic tunnel junction indicates a large magnetoresistance change ratio, and the element has received attention since then.

The ferromagnetic tunnel junction includes, as a basic structure, a storage layer having a variable magnetization, a reference layer having an invariable magnetization, and a tunnel barrier layer (an insulating layer) between these layers. When a current flows through this ferromagnetic tunnel junction, a tunnel current flows through the tunnel barrier layer. At this time, a resistance of the ferromagnetic tunnel junction changes in accordance with a relative angle of magnetization directions of the storage layer and the reference layer.

For example, when the magnetization directions of the storage layer and the reference layer are parallel, the resistance of the ferromagnetic tunnel junction has a minimum value. When the magnetization directions of the storage layer and the reference layer are antiparallel, the resistance of the ferromagnetic tunnel junction has a maximum value. This resistance change is called a tunneling magneto-resistance effect (the TMR effect). When the magnetoresistive element including this ferromagnetic tunnel junction is used as a memory cell, the parallel/antiparallel magnetization directions of the storage layer and the reference layer are associated with "0"/"1" of binary data.

As a write operation in the magnetoresistive element, a so-called magnetic write system is known in which a write line is disposed in the vicinity of the element, and the only magnetization direction of the storage layer is reversed by a magnetic field generated by the current flowing through the write line. In this system, however, when an element size is made small to realize a large-capacity memory, coercive force Hc of a magnetic material constituting the storage layer becomes large in principle. Therefore, the current required for writing tends to become larger, as the element is miniaturized.

On the other hand, the magnetic field from the write line, in principle, becomes small in accordance with the reduction of the element size. Therefore, in the magnetic write system, the reduction of the element size is not easily compatible with the lowering of the write current as required for large-capacity design.

In recent years, a write (spin injection write) system using a spin momentum transfer (SMT) has been suggested as a write system to solve this problem. In this system, a spin-polarized current flows through the magnetoresistive element to reverse the magnetization direction of the storage layer. Further in this system, the smaller a volume of the storage layer is, the less spin-polarized electrons to be injected into the layer become. Therefore, the system has been expected as a write system in which the miniaturization of the element is compatible with the lowering of the current.

However, when the element is miniaturized to achieve the large capacity, an energy barrier for maintaining the magnetization direction of the storage layer in one direction, i.e., magnetic anisotropy energy becomes smaller than heat energy. In consequence, a problem occurs that the magnetization direction of the storage layer fluctuates (the generation of thermal disturbance) and that the data cannot be held.

In general, the energy barrier required for reversing the magnetization direction is represented by a product of magnetic anisotropy (the magnetic anisotropy energy per unit volume) and a unit volume of magnetization reversal. Therefore, when a resistance to the thermal disturbance is acquired with a micro element size, the storage layer is preferably constituted of a material having a large magnetic anisotropy.

In an in-plane magnetization type which has mainly been investigated, a shape magnetic anisotropy is usually utilized. In this case, for increasing the magnetic anisotropy energy, there are required countermeasures such as the increasing of an aspect ratio of the magnetoresistive element, the thickening of the storage layer and the increasing of a saturated magnetization of the storage layer. However, when characteristics of the spin injection system are taken into consideration, these countermeasures incur the increase of a reversal current, and are not suitable for the miniaturization.

On the other hand, it can be considered that a material which does not have the shape magnetic anisotropy but has large crystal magnetic anisotropy is utilized. In this case, an easy axis of magnetization in an in-plane direction is noticeably dispersed in a film face. Therefore, a magnetoresistance ratio (the MR ratio) lowers, and incoherent precession is induced. In consequence, the reversal current increases. Therefore, this countermeasure is not desirable.

Moreover, the in-plane magnetization type utilizes the magnetic anisotropy generated in accordance with a shape of the element, and hence a value of the reversal current is influenced by the shape. In consequence, it is feared that the scatterings of the reversal current increase in accordance with the miniaturization of the element.

On the other hand, a technology has been suggested in which so-called perpendicular magnetization film including the easy axis of magnetization in a direction perpendicular to the film face is used in the ferromagnetic material constituting the magnetoresistive element. When the crystal magnetic anisotropy is generated by the perpendicular magnetization type, the shape magnetic anisotropy is not utilized. Therefore, the shape of the element can be very small as compared with the in-plane magnetization type. Moreover, the dispersion of the magnetization easy direction can be small. Consequently, when the material having large crystal magnetic anisotropy is employed, the miniaturization can be compatible with the low current, while maintaining the thermal disturbance resistance.

Figure 8:
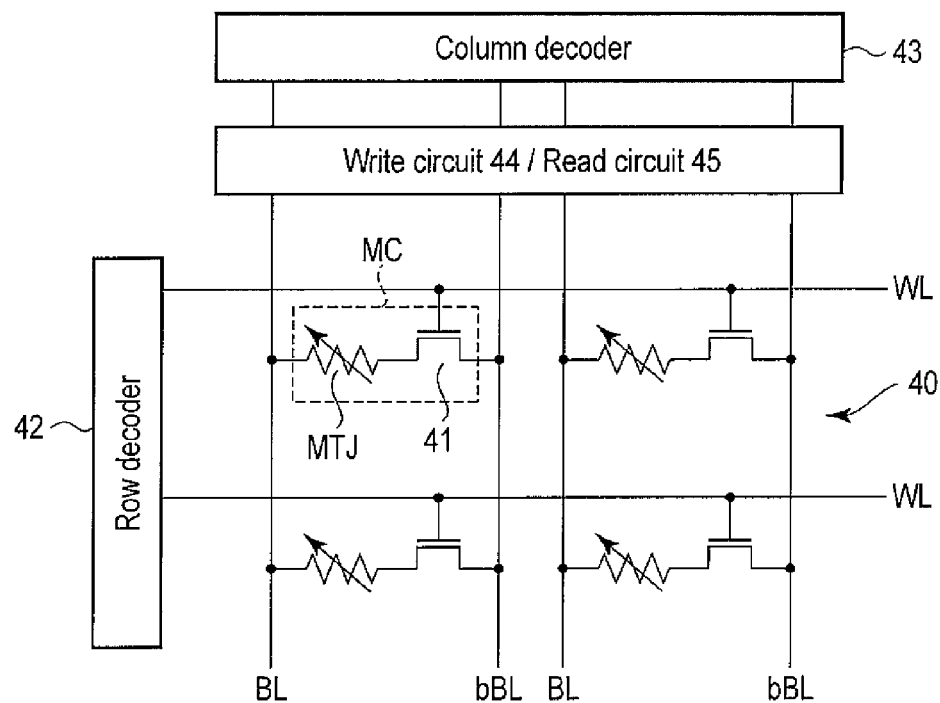
FIG. 8 is a diagram showing a main part of an MRAM.

FIG. 8 shows an MRAM.

The MRAM includes memory cell array 40 including memory cells MC arranged in a matrix manner. Memory cell array 40 includes bit line pairs BL and bBL extending in a column direction, and word lines WL extending in a row direction.

In intersecting portions of bit line pairs BL and bBL and word lines WL, memory cells MC are arranged. Each memory cell MC includes magnetoresistive element MTJ and switch element (e.g., an N-channel MOS transistor) 41 which are connected in series.

A first terminal of memory cell MC is connected to bit line BL, and a second terminal is connected to bit line bBL. A control terminal (e.g., a gate of the N-channel MOS transistor) which determines an on/off-state of switch element 41 is connected to word line WL.

One end of word line WL is connected to row decoder 42. One end of bit line pair BL and bBL is connected to write circuit 44 and read circuit 45. Write circuit 44 and read circuit 45 are connected to column decoder 43. Each memory cell MC is selected by row decoder 42 and column decoder 43.

The writing of data in memory cell MC is performed as follows.

First, word line WL connected to selected memory cell MC which becomes an object of the data writing is activated to turn on switch element 41 in selected memory cell MC.

Here, a direction of write current (bidirectional current) Iw flowing through magnetoresistive element MTJ is determined in accordance with the write data.

For example, when data "0" is written, write current Iw directed from bit line BL to bit line bBL is supplied to magnetoresistive element MTJ. In this case, write circuit 44 may apply a positive voltage to bit line BL, and apply a ground voltage to bit line bBL.

Moreover, when data "1" is written, write current Iw directed from bit line bBL to bit line BL is supplied to magnetoresistive element MTJ. In this case, write circuit 44 may apply the positive voltage to bit line bBL, and apply the ground voltage to bit line BL.

In this manner, data "0" or data "1" can be written in selected memory cell MC.

Next, the data is read from memory cell MC as follows.

First, switch element 41 in selected memory cell MC is turned on. Read circuit 45 allows read current Ir to flow through magnetoresistive element MTJ. Then, read circuit 45 detects a resistance value of magnetoresistive element MTJ in selected memory cell MC on the basis of read current Ir. In this manner, the data stored in magnetoresistive element MTJ can be read.

It is to be noted that there are not any special restrictions on the direction of read current Ir, but to prevent wrong writing during the reading, a value of read current Ir needs to be sufficiently smaller than that of write current Iw.

Next, a device structure of the memory cell of the MRAM will be described.

Figure 9:
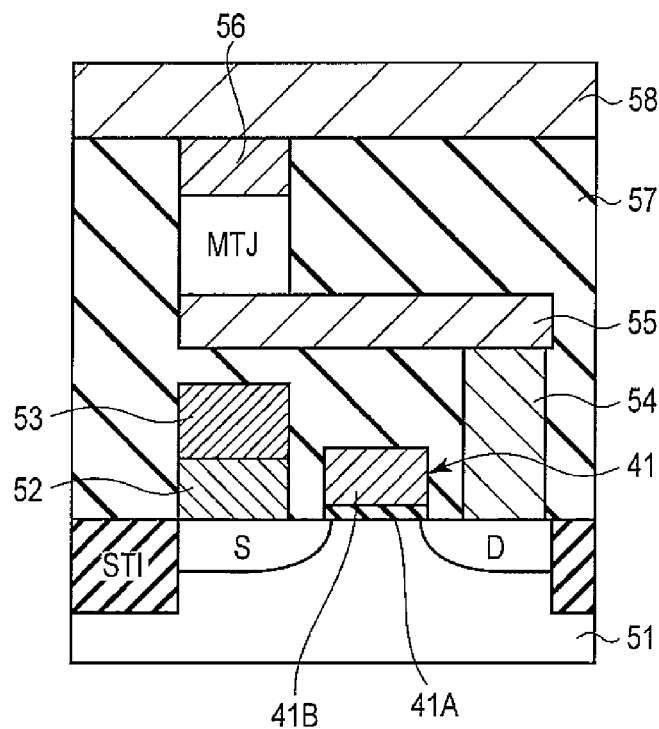
FIG. 9 is a diagram showing a memory cell of the MRAM.

FIG. 9 shows the device structure of the memory cell.

In a surface area of semiconductor substrate 51, an element isolation area (element isolation insulating layer STI) is disposed. In an active area surrounded with this element isolation area, switch element 41 is disposed. The element isolation area includes, for example, silicon oxide having a shallow trench isolation (STI) structure.

In the active area, source area S and drain area D are arranged. Source area S and drain area D are, for example, $N^+$-type impurity diffusion areas in P-type semiconductor substrate 51. On semiconductor substrate 51 between source area S and drain area D, gate electrode 41B is disposed via gate insulating film 41A. Gate electrode 41B functions as word line WL.

On source area S, conductive line 53 is disposed via contact plug 52. Conductive line 53 functions as bit line bBL. On drain area D, lower electrode 55 is disposed via contact plug 54. On lower electrode 55, for example, magnetoresistive elements MTJ of FIG. 1 to FIG. 3 are disposed.

In the present example, cap layer 56 is disposed on magnetoresistive element MTJ. Cap layer 56 functions as a hard mask layer during the patterning of magnetoresistive element MTJ, and also functions as a protective layer to protect magnetoresistive element MTJ. On cap layer 56, conductive line 58 is disposed. Conductive line 58 functions as bit line BL.

Moreover, a space between semiconductor substrate 51 and conductive line 58 is filled with interlayer insulating layer 57 of, for example, silicon oxide or the like.

As described above in detail, a magnetic memory such as the MRAM can be constituted by using magnetoresistive element MTJ of the embodiment. It is to be noted that magnetoresistive element MTJ can be used as a magnetic wall transfer type magnetic memory, in addition to a spin injection type magnetic memory.

APPLICATION EXAMPLES

The above magnetic memory can be applied to various electronic apparatuses. Hereinafter, application examples of the magnetic memory will be described.

(1) DSL Data Path Section of Modem for DSL

Figure 10:
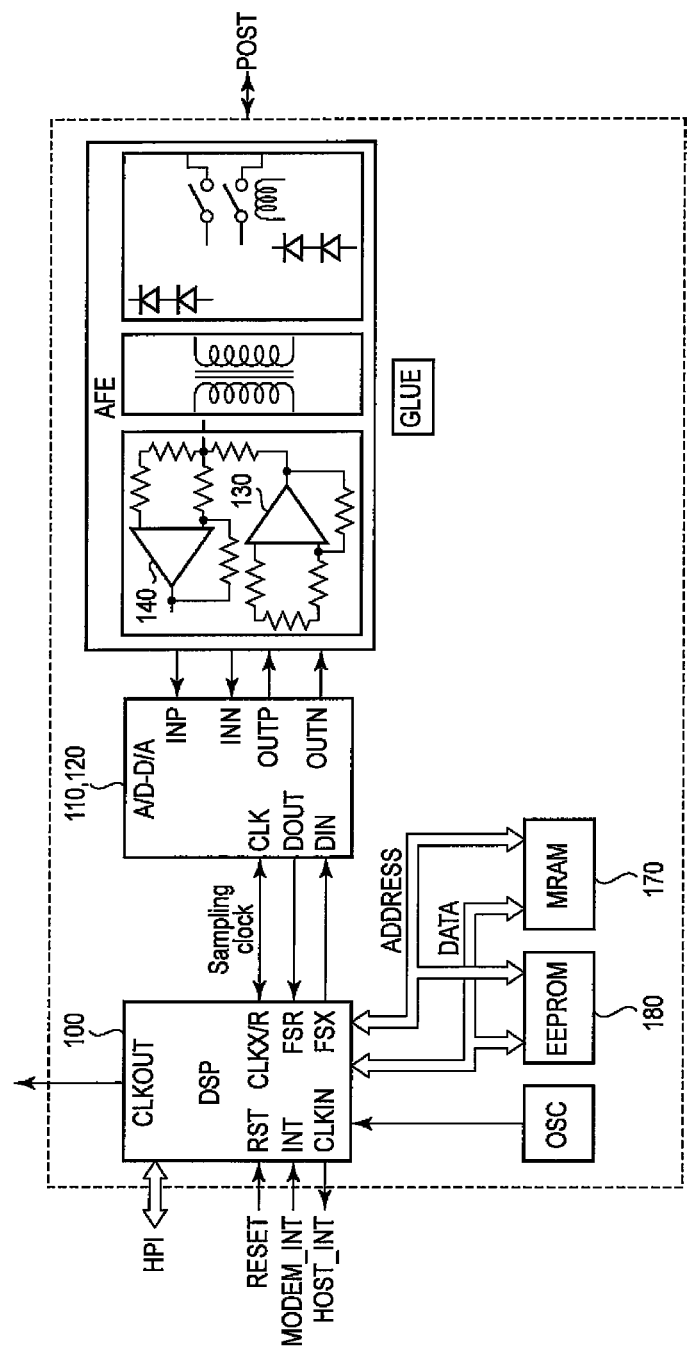
FIG. 10 is a diagram showing a DSL data path section as an application example.

FIG. 10 shows an extracted DSL data path section of a modem for a digital subscriber line (DSL).

This modem includes programmable digital signal processor (programmable DSP) 100, analog-digital (A/D) converter 110, digital-analog (D/A) converter 120, transmission driver 130, and reception amplifier 140.

In the diagram, a band path filter is omitted, and in place of the filter, MRAM 170 and EEPROM 180 are provided. These memories function as option memories for holding a circuit code program. Here, the circuit code program is a program executed by the DSP, to select or operate the modem in accordance with coded subscriber circuit information, transmission conditions and the like (circuit codes: QAM, CAP, RSK, FM, AM, PAM, DWMT, etc.).

In this application example, MRAM 170 and EEPROM 180 are used as the memories for holding the circuit code program, but EEPROM 180 may be replaced with an MRAM. That is, the memory for holding the circuit code program can be constituted only of the MRAM.

(2) Cellular Phone Terminal

FIG. 11 shows a cellular phone terminal.

This cellular phone terminal is realized as a microcomputer in which a communicating section and a controller are connected via bus 225.

The communicating section includes transmission/reception antenna 201, antenna duplexer 202, receiver 203, base band processor 204, DSP 205 for use as a voice codec, speaker 206, microphone 207, transmitter 208, and frequency synthesizer 209. Moreover, the controller includes CPU 221, ROM 222, and MRAM 223 and flash memory 224 of the present embodiment.

In ROM 222, data such as a program executed in CPU 221 and a font for display is beforehand stored. MRAM 223 is used mainly as a work area. MRAM 223 stores data which is being calculated, and temporarily stores data transmitted/received between the controller and the communicating section, when CPU 221 is executing the program.

Flash memory 224 is used to store, for example, immediately previous set conditions, even when a power source of the cellular phone terminal is turned off, and the memory is used to store set parameters for realizing a use method to obtain the same settings when the power source is turned on next time. In consequence, even when the power source of the cellular phone terminal is turned off, the stored set parameters do not disappear.

Moreover, to this cellular phone terminal, there are added audio data reproduction processor 211, external output terminal 212, LCD controller 213, displaying liquid crystal display (LCD) 214, and ringer 215 to generate call sound.

Audio data reproduction processor 211 reproduces audio information input into the cellular phone terminal (or audio information stored in external memory 240). The reproduced audio information is transmitted to a headphone, a portable speaker or the like via external output terminal 212. In consequence, voice is output to the outside.

When audio data reproduction processor 211 is provided in this manner, the audio information can be reproduced. LCD controller 213 receives, for example, display information from CPU 221 via bus 225, converts this information into LCD control information for controlling LCD 214, and further drives LCD 214 to perform LCD display.

Further to the cellular phone terminal, interface circuits (I/F) 231, 233 and 235, external memory 240, external memory slot 232, key operation unit 234 and external input/output terminal 236 are added.

External memory 240 such as a memory card is inserted into external memory slot 232. External memory slot 232 is connected to bus 225 via interface circuit (I/F) 231.

When the cellular phone terminal is provided with slot 232 in this manner, internal information of the cellular phone terminal can be written in external memory 240, or information stored in external memory 240 (e.g., the audio information) can be input into cellular phone terminal 300.

Key operation unit 234 is connected to bus 225 via interface circuit (I/F) 233. Key input information input through key operation unit 234 is transmitted to, for example, CPU 221. External input/output terminal 236 is connected to bus 225 via interface circuit (I/F) 233, and is used for inputting information into the cellular phone terminal from the outside or for outputting the information from the cellular phone terminal to the outside.

It is to be noted that in the present application example, three memories of ROM 222, MRAM 223 and flash memory 224 are used, but at least one of ROM 222 and flash memory 224 can be replaced with an MRAM. For example, ROM 222 and flash memory 224 may be omitted.

(3) MRAM Card

Here, the application of the MRAM of the embodiment to a card to store media contents of smart media or the like will be described.

Figure 12:
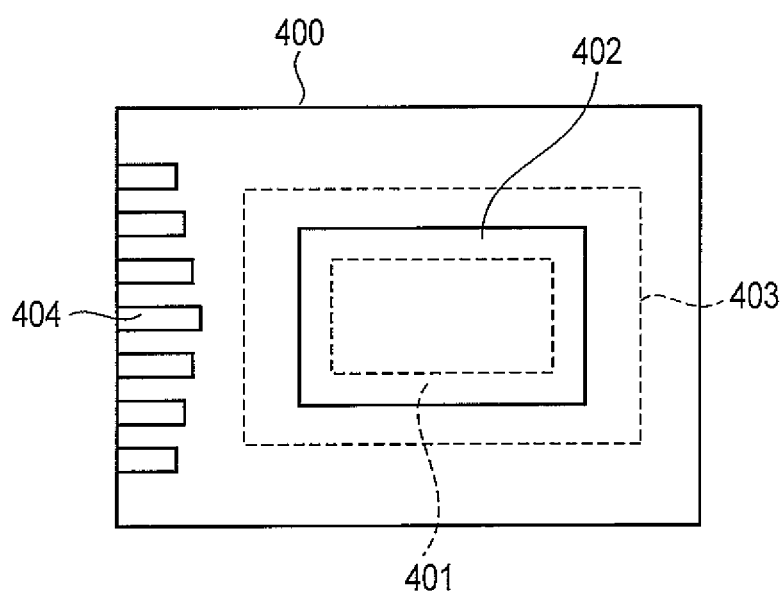
FIG. 12 is a diagram showing an MRAM card as still another application example.

FIG. 12 shows an MRAM card. FIG. 13 to FIG. 16 show MRAM card systems.

In MRAM card main body 400, MRAM chip 401 is contained. In MRAM card main body 400, opening 402 is provided at a position corresponding to MRAM chip 401, whereby MRAM chip 401 is exposed. Opening 402 is provided with shutter 403. When MRAM card is carried, MRAM chip 401 is protected by shutter 403. Shutter 403 is preferably made of a material having an effect of shielding the chip from an external magnetic field, for example, a ceramic.

When the transfer of the data is executed, shutter 403 is opened, to expose MRAM chip 401. Through external terminal 404, content data stored in MRAM card is taken out.

FIG. 13 and FIG. 14 show transfer devices which transfer the data to the MRAM card.

Transfer device 500 is a card insertion type. Transfer device 500 includes storage section 500a. In storage section 500a, first MRAM card 550 is stored. Storage section 500a is provided with external terminal 530 electrically connected to first MRAM card 550, and the data of first MRAM card 550 is rewritten by using external terminal 530.

Second MRAM card 450 for use by an end user is inserted through inserting section 510 of transfer device 500 as shown by an arrow, and pushed into the device until the card stops at stopper 520. Stopper 520 works also as a member for positioning first MRAM card 550 and second MRAM card 450. When second MRAM card 450 is disposed at a predetermined position, a controller in first MRAM card 550 supplies a control signal to external terminal 530, and the data stored in first MRAM card 550 is transferred to second MRAM card 450.

FIG. 15 shows a fitting type transfer device.

Transfer device 500 is of such a type that second MRAM card 450 is fitted onto first MRAM card 550 by use of stopper 520 which is a target as shown by an arrow. A transfer method is the same as in the card insertion type, and hence description thereof is omitted.

FIG. 16 shows a slide type transfer device.

Transfer device 500 is provided with tray slide 560 for transfer device 500 in the same manner as in a CD-ROM drive or a DVD drive, and tray slide 560 moves as shown by arrows. When tray slide 560 moves to a position of broken lines, second MRAM card 450 is disposed on tray slide 560, and second MRAM card 450 is conveyed into transfer device 500.

Second MRAM card 450 is conveyed so that a tip portion of the card comes in contact with stopper 520, and data is transferred, in the same manner as in the card insertion type, and hence description thereof is omitted.

(Conclusion)

According to the embodiments, a stray magnetic field which increases in accordance with the miniaturization of a magnetoresistive element can securely be canceled by a shift adjustment layer.

The embodiments produce large industrial merits in a high-speed random writable file memory, a high-speed down-loadable portable terminal, a high-speed down-loadable portable player, a semiconductor memory for a broadcasting apparatus, a drive recorder, a home video, a large-capacity buffer memory for communication, a semiconductor memory for a security camera, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
   a storage layer having a perpendicular and variable magnetization;
   a reference layer having a perpendicular and invariable magnetization;
   a shift adjustment layer having a perpendicular and invariable magnetization in a direction opposite to a magnetization of the reference layer;
   a first nonmagnetic layer between the storage layer and the reference layer; and
   a second nonmagnetic layer between the reference layer and the shift adjustment layer,
   wherein a magnetization reversal of the storage layer is performed by a spin injection writing, a switching magnetic field of the reference layer is equal to or smaller than a switching magnetic field of the storage layer, a magnetic relaxation constant of the reference layer is larger than a magnetic relaxation constant of the storage layer, and an energy barrier of a magnetization reversal of the reference layer is larger than an energy barrier of the magnetization reversal of the storage layer.

2. The element of claim 1, wherein an effective magnetic anisotropy of the reference layer is equal to or smaller than an effective magnetic anisotropy of the storage layer.

3. The element of claim 1, wherein the reference layer is disposed above the storage layer, and the shift adjustment layer is disposed above the reference layer.

4. The element of claim 1, wherein the reference layer includes one of artificial lattice series and RE-TM alloy series.

5. The element of claim 1, wherein the storage layer includes one of CoFe-X series (X is at least one of B, C, and N), ordered alloy series, artificial lattice series and disordered alloy series.

6. The element of claim 1, wherein an interface layer is interposed in at least one of a space between the storage layer and the first nonmagnetic layer and a space between the reference layer and the first nonmagnetic layer.

7. The element of claim 6, wherein the interface layer includes $(CO_{100-x}Fe_x)_{100-y}B_y$ (with the proviso that x≥50 at %, and 0≤y≤30 at %).

8. A magnetic memory comprising:
the element of claim 1; and
a write circuit which allows a bidirectional current to flow through the magnetoresistive element, so that a relation in magnetization direction between the storage layer and the reference layer becomes parallel or antiparallel.

9. The memory of claim 8, further comprising:
a switch element disposed right under the magnetoresistive element, and configured to selectively allow the bidirectional current to flow through the magnetoresistive element.

10. The memory of claim 9, wherein the magnetoresistive element and the switch element are connected in series, to constitute a series connector including first and second terminals and a control terminal which determines an on/off-state of the switch element,
the first terminal is connected to a first bit line, the second terminal is connected to a second bit line, and the control terminal is connected to a word line.

11. A magnetoresistive element comprising:
a storage layer having a perpendicular and variable magnetization;
a reference layer having a perpendicular and invariable magnetization;
a shift adjustment layer having a perpendicular and invariable magnetization in a direction opposite to a magnetization of the reference layer; and
a nonmagnetic layer between the storage layer and the reference layer,
wherein a magnetization reversal of the storage layer is performed by a spin injection writing, a switching magnetic field of the reference layer is equal to or smaller than a switching magnetic field of the storage layer, a magnetic relaxation constant of the reference layer is larger than a magnetic relaxation constant of the storage layer, and an energy barrier of a magnetization reversal of the reference layer is larger than an energy barrier of the magnetization reversal of the storage layer.

12. The element of claim 11, wherein an effective magnetic anisotropy of the reference layer is equal to or smaller than an effective magnetic anisotropy of the storage layer.

13. The element of claim 11, wherein the reference layer is disposed above the storage layer, and the shift adjustment layer is disposed above the reference layer.

14. The element of claim 11, wherein the reference layer includes one of artificial lattice series and RE-TM alloy series.

15. The element of claim 11, wherein the storage layer includes one of CoFe-X series (X is at least one of B, C, and N), ordered alloy series, artificial lattice series and disordered alloy series.

16. The element of claim 11, wherein an interface layer is interposed in at least one of a space between the storage layer and the nonmagnetic layer and a space between the reference layer and the nonmagnetic layer.

17. The element of claim 16, wherein the interface layer includes $(Co_{100-x}Fe_x)_{100-y}B_y$ (with the proviso that x≥50 at %, and 0≤y≤30 at %).

18. A magnetic memory comprising:
the element of claim 11; and
a write circuit which allows a bidirectional current to flow through the magnetoresistive element, so that a relation in magnetization direction between the storage layer and the reference layer becomes parallel or antiparallel.

19. The memory of claim 18, further comprising:
a switch element disposed right under the magnetoresistive element, and configured to selectively allow the bidirectional current to flow through the magnetoresistive element.

20. The memory of claim 19, wherein the magnetoresistive element and the switch element are connected in series, to constitute a series connector including first and second terminals and a control terminal which determines an on/off-state of the switch element,
the first terminal is connected to a first bit line, the second terminal is connected to a second bit line, and the control terminal is connected to a word line.

21. A magnetoresistive element comprising:
a storage layer having a perpendicular and variable magnetization;
a reference layer having a perpendicular and invariable magnetization;
a shift adjustment layer having a perpendicular and invariable magnetization in a direction opposite to a magnetization of the reference layer;
a first nonmagnetic layer between the storage layer and the reference layer; and
a second nonmagnetic layer between the reference layer and the shift adjustment layer,
wherein a magnetization reversal of the storage layer is performed by a spin injection writing, a switching magnetic field of the reference layer is equal to or smaller than a switching magnetic field of the storage layer, a magnetic relaxation constant of the reference layer is larger than a magnetic relaxation constant of the storage layer, and a write current which is necessary for a magnetization reversal of the reference layer is larger than a write current which is necessary for the magnetization reversal of the storage layer.

22. The element of claim 21, wherein an effective magnetic anisotropy of the reference layer is equal to or smaller than an effective magnetic anisotropy of the storage layer.

23. The element of claim 21, wherein the reference layer is disposed above the storage layer, and the shift adjustment layer is disposed above the reference layer.

24. The element of claim 21, wherein the reference layer includes one of artificial lattice series and RE-TM alloy series.

25. The element of claim 21, wherein the storage layer includes one of CoFe-X series (X is at least one of B, C, and N), ordered alloy series, artificial lattice series and disordered alloy series.

26. The element of claim 21, wherein an interface layer is interposed in at least one of a space between the storage layer and the first nonmagnetic layer and a space between the reference layer and the first nonmagnetic layer.

27. The element of claim 26, wherein the interface layer includes $(Co_{100-x}Fe_x)_{100-y}B_y$ (with the proviso that x≥50 at %, and 0≤y≤30 at %).

28. A magnetic memory comprising:
the element of claim 21; and
a write circuit which allows a bidirectional current to flow through the magnetoresistive element, so that a relation in magnetization direction between the storage layer and the reference layer becomes parallel or antiparallel.

29. The memory of claim 28, further comprising:
a switch element disposed right under the magnetoresistive element, and configured to selectively allow the bidirectional current to flow through the magnetoresistive element.

30. The memory of claim 29, wherein the magnetoresistive element and the switch element are connected in series, to constitute a series connector including first and second terminals and a control terminal which determines an on/off-state of the switch element,
the first terminal is connected to a first bit line, the second terminal is connected to a second bit line, and the control terminal is connected to a word line.

31. A magnetoresistive element comprising:
a storage layer having a perpendicular and variable magnetization;
a reference layer having a perpendicular and invariable magnetization;
a shift adjustment layer having a perpendicular and invariable magnetization in a direction opposite to a magnetization of the reference layer; and
a nonmagnetic layer between the storage layer and the reference layer,
wherein a magnetization reversal of the storage layer is performed by a spin injection writing, a switching magnetic field of the reference layer is equal to or smaller than a switching magnetic field of the storage layer, a magnetic relaxation constant of the reference layer is larger than a magnetic relaxation constant of the storage layer, and a write current which is necessary for a magnetization reversal of the reference layer is larger than a write current which is necessary for the magnetization reversal of the storage layer.

32. The element of claim 31, wherein an effective magnetic anisotropy of the reference layer is equal to or smaller than an effective magnetic anisotropy of the storage layer.

33. The element of claim 31, wherein the reference layer is disposed above the storage layer, and the shift adjustment layer is disposed above the reference layer.

34. The element of claim 31, wherein the reference layer includes one of artificial lattice series and RE-TM alloy series.

35. The element of claim 31, wherein the storage layer includes one of CoFe-X series (X is at least one of B, C, and N), ordered alloy series, artificial lattice series and disordered alloy series.

36. The element of claim 31, wherein an interface layer is interposed in at least one of a space between the storage layer and the nonmagnetic layer and a space between the reference layer and the nonmagnetic layer.

37. The element of claim 36, wherein the interface layer includes $(Co_{100-x}Fe_x)_{100-y}B_y$ (with the proviso that x≥50 at %, and 0≤y≤30 at %).

38. A magnetic memory comprising:
the element of claim 31; and
a write circuit which allows a bidirectional current to flow through the magnetoresistive element, so that a relation in magnetization direction between the storage layer and the reference layer becomes parallel or antiparallel.

39. The memory of claim 38, further comprising:
a switch element disposed right under the magnetoresistive element, and configured to selectively allow the bidirectional current to flow through the magnetoresistive element.

40. The memory of claim 39, wherein the magnetoresistive element and the switch element are connected in series, to constitute a series connector including first and second terminals and a control terminal which determines an on/off-state of the switch element,
the first terminal is connected to a first bit line, the second terminal is connected to a second bit line, and the control terminal is connected to a word line.

* * * * *